US008125418B2

(12) United States Patent
Cok

(10) Patent No.: US 8,125,418 B2
(45) Date of Patent: Feb. 28, 2012

(54) PASSIVE-MATRIX CHIPLET DRIVERS FOR DISPLAYS

(75) Inventor: Ronald S. Cok, Rochester, NY (US)

(73) Assignee: Global OLED Technology LLC, Herndon, VA (US)

(*) Notice: Subject to any disclaimer, the term of this patent is extended or adjusted under 35 U.S.C. 154(b) by 469 days.

(21) Appl. No.: 12/492,678

(22) Filed: Jun. 26, 2009

(65) Prior Publication Data
US 2010/0328196 A1 Dec. 30, 2010

(51) Int. Cl.
G09G 3/36 (2006.01)
(52) U.S. Cl. ............................................. 345/76; 345/82
(58) Field of Classification Search .............. 345/76–82, 345/87–100, 204, 211
See application file for complete search history.

(56) References Cited

U.S. PATENT DOCUMENTS

| 4,769,292 | A | 9/1988 | Tang et al. | |
|---|---|---|---|---|
| 5,061,569 | A | 10/1991 | VanSlyke et al. | |
| 6,384,529 | B2 | 5/2002 | Tang et al. | |
| 6,919,681 | B2 | 7/2005 | Cok et al. | |
| 6,987,355 | B2 | 1/2006 | Cok | |
| 7,230,594 | B2 | 6/2007 | Miller et al. | |
| 7,859,493 | B2 * | 12/2010 | Sempel et al. | 345/82 |
| 7,999,454 | B2 * | 8/2011 | Winters et al. | 313/500 |
| 2006/0055864 | A1 | 3/2006 | Matsumura | |
| 2006/0250331 | A1 * | 11/2006 | Sempel et al. | 345/76 |
| 2006/0262050 | A1 | 11/2006 | Ogawa et al. | 345/76 |
| 2007/0057263 | A1 | 3/2007 | Kahen | |
| 2010/0149139 | A1 * | 6/2010 | Kroll et al. | 345/204 |
| 2010/0149311 | A1 * | 6/2010 | Kroll et al. | 348/40 |
| 2011/0109670 | A1 * | 5/2011 | Sempel et al. | 345/692 |
| 2011/0157264 | A1 * | 6/2011 | Seshadri et al. | 345/698 |
| 2011/0279493 | A1 * | 11/2011 | Phan | 345/694 |

FOREIGN PATENT DOCUMENTS

| EP | 1 187 212 A1 | 3/2002 |
|---|---|---|
| EP | 1 306 827 A1 | 5/2003 |
| EP | 1 437 703 A1 | 7/2004 |

OTHER PUBLICATIONS

A novel use of MEMS switches in driving AMOLED, by Yoon, Lee, Yang and Jang, SID 08 Digest, p. 13.

* cited by examiner

Primary Examiner — Nitin Patel
(74) Attorney, Agent, or Firm — Morgan, Lewis & Bockius LLP

(57) ABSTRACT

A passive-matrix display device having a plurality of chiplets, each chiplet associated with one or more independent column electrodes located in the display area, each chiplet electrically connected to and driving a separate subset of the independent column electrodes and electrically connected to and driving a subset of the row electrodes to cause the light-emitting material in each pixel to emit light, wherein each chiplet includes a serial luminance shift register for shifting pixel luminance values corresponding to each independent column electrode from one chiplet to another and a column driver for driving each of the independent column electrodes to which it is connected with the corresponding pixel luminance values; and wherein each chiplet further includes a row driver for driving each corresponding row electrode to which it is connected and a row control shift register for controlling the row drivers.

16 Claims, 11 Drawing Sheets

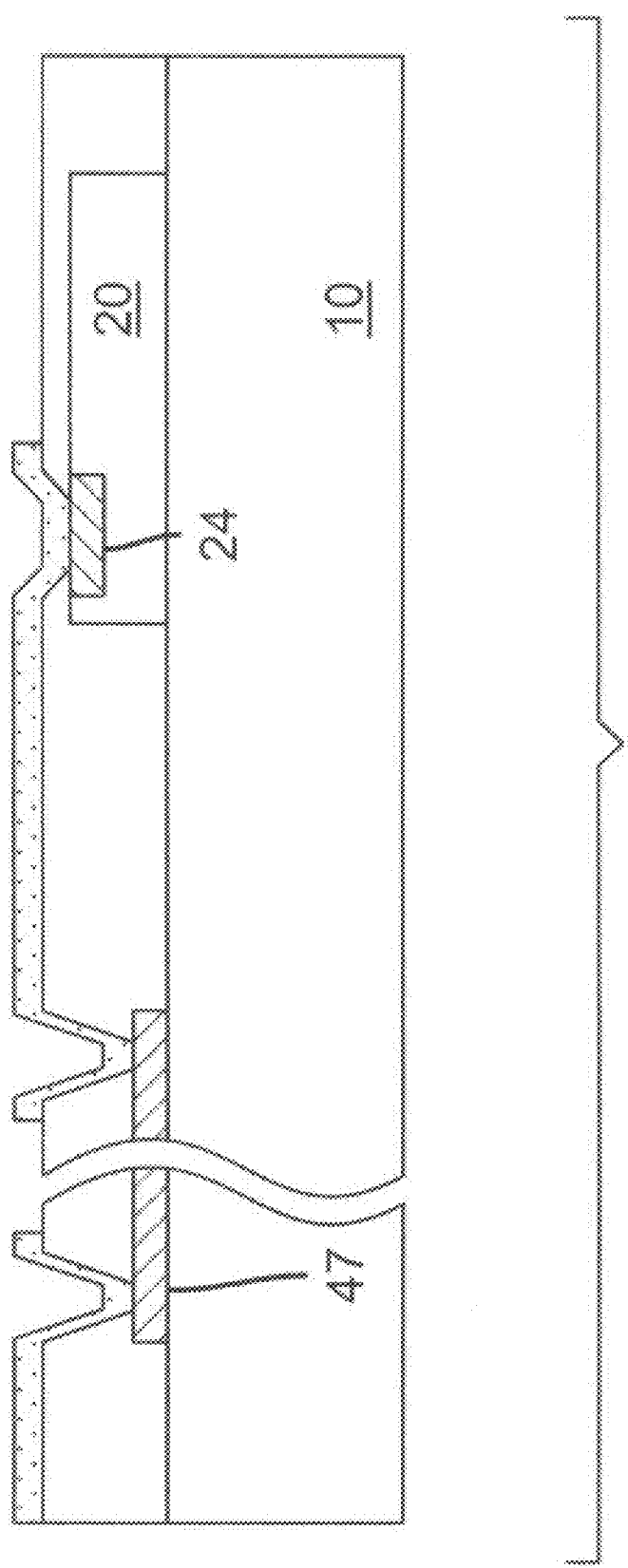

PASSIVE-MATRIX CHIPLET DRIVERS FOR DISPLAYS

CROSS REFERENCE TO RELATED APPLICATIONS

Reference is made to commonly assigned U.S. patent application Ser. No. 12/372,906, filed Feb. 18, 2009, entitled Display Device With Chiplet Drivers, by Ronald S. Cok, et al; Ser. No. 12/371,666, filed Feb. 16, 2009, entitled Chiplet Display Device With Serial Control, by Ronald S. Cok; Ser. No. 12/424,060, filed Apr. 15, 2009, entitled Display Device With Polygonal Chiplets, by Ronald S. Cok, and Ser. No. 12/431,925, filed Apr. 29, 2009, entitled Chiplet Display With Oriented Chiplets And Busses, by Ronald S. Cok, the disclosures of which are incorporated herein.

FIELD OF THE INVENTION

The present invention relates to passive-matrix display devices having particular chiplet configurations for facilitating improved operation.

BACKGROUND OF THE INVENTION

Flat-panel display devices are widely used in conjunction with computing devices, in portable devices, and for entertainment devices such as televisions. Such displays typically employ a plurality of pixels distributed over a substrate to display images. Each pixel incorporates several, differently colored light-emitting elements commonly referred to as sub-pixels, typically emitting red, green, and blue light, to represent each image element. As used herein, pixels can refer to a single light-emitting element or a group of differently colored light-emitting elements. A variety of flat-panel display technologies are known, for example plasma displays, liquid crystal displays, and light-emitting diode (LED) displays.

Light emitting diodes (LEDs) incorporating thin films of light-emitting materials forming light-emitting elements have many advantages in a flat-panel display device and are useful in optical systems. U.S. Pat. No. 6,384,529 to Tang et al. shows an organic LED (OLED) color display that includes an array of organic LED light-emitting elements. Alternatively, inorganic materials can be employed and can include phosphorescent crystals or quantum dots in a polycrystalline semiconductor matrix. Other thin films of organic or inorganic materials can also be employed to control charge injection, transport, or blocking to the light-emitting-thin-film materials, and are known in the art. The materials are placed upon a substrate between electrodes, with an encapsulating cover layer or plate. Light is emitted from a pixel when current passes through the light-emitting material. The frequency of the emitted light is dependent on the nature of the material used. In such a display, light can be emitted through the substrate (a bottom emitter) or through the encapsulating cover (a top emitter), or both.

LED devices can include a patterned light-emissive layer wherein different materials are employed in the pattern to emit different colors of light when current passes through the materials. Alternatively, one can employ a single emissive layer, for example, a white-light emitter, together with color filters for forming a full-color display, as is taught in U.S. Pat. No. 6,987,355 by Cok. It is also known to employ a white sub-pixel that does not include a color filter, for example, as taught in U.S. Pat. No. 6,919,681 by Cok et al. This and other disclosures teach a design employing an unpatterned white emitter together with a four-color pixel including red, green, and blue color filters and sub-pixels and an unfiltered white sub-pixel to improve the efficiency of the device (see, e.g. U.S. Pat. No. 7,230,594 to Miller, et al).

Two different methods for controlling the pixels in a flat-panel display device are generally known: active-matrix control and passive-matrix control. In a passive-matrix device, the substrate does not include any active electronic elements (e.g. transistors). An array of row electrodes and an orthogonal array of column electrodes in a separate layer are formed over the substrate; the intersections where the row and column electrodes overlap form the electrodes of a light-emitting diode. External driver chips then sequentially supply current to each row (or column) while the orthogonal column (or row) supplies a suitable voltage to illuminate each light-emitting diode in the row (or column). Therefore, a passive-matrix design employs 2n connections to produce $n^2$ separately controllable light-emitting elements. However, a passive-matrix drive device is limited in the number of rows (or columns) that can be included in the device since the sequential nature of the row (or column) driving creates flicker. If too many rows are included, the flicker can become perceptible. Moreover, the currents necessary to drive an entire row (or column) in a display can be problematic and the power required for the non-imaging pre-charge and discharge steps of PM driving become dominant as the area of the PM display grows. These two problems limit the physical size of a passive-matrix display.

In an active-matrix device, active control elements are formed of thin films of semiconductor material, for example amorphous or poly-crystalline silicon, distributed over the flat-panel substrate. Typically, each sub-pixel is controlled by one control element and each control element includes at least one transistor. For example, in a simple active-matrix organic light-emitting (OLED) display, each control element includes two transistors (a select transistor and a drive transistor) and one capacitor for storing a charge specifying the luminance of the sub-pixel. Each light-emitting element typically employs an independent control electrode and a common electrode. Control of the light-emitting elements is typically provided through a data signal line, a select signal line, a power connection and a ground connection. Active-matrix elements are not necessarily limited to displays and can be distributed over a substrate and employed in other applications requiring spatially distributed control. The same number of external control lines (except for power and ground) can be employed in an active-matrix device as in a passive-matrix device. However, in an active-matrix device, each light-emitting element has a separate driving connection from a control circuit and is active even when not selected for data deposition so that flicker is eliminated.

One common, prior-art method of forming active-matrix control elements typically deposits thin films of semiconductor materials, such as silicon, onto a glass substrate and then forms the semiconductor materials into transistors and capacitors through photolithographic processes. The thin-film silicon can be either amorphous or polycrystalline. Thin-film transistors (TFTs) made from amorphous or polycrystalline silicon are relatively large and have lower performance compared to conventional transistors made in crystalline silicon wafers. Moreover, such thin-film devices typically exhibit local or large-area non-uniformity across the glass substrate that results in non-uniformity in the electrical performance and visual appearance of display employing such materials.

Employing an alternative control technique, Matsumura et al., in U.S. Patent Application Publication No. 2006/0055864, describe crystalline silicon substrates used for driving LCD displays. The application describes a method for selectively transferring and affixing pixel-control devices made from first semiconductor substrates onto a second planar display substrate. Wiring interconnections within the pixel-control device and connections from busses and control electrodes to the pixel-control device are shown.

Since a conventional passive-matrix display design is limited in size and number of light-emitting elements, and an active-matrix design using TFTs has lower electrical performance, there is a need for improved control for display devices employing LEDs that overcomes these problems.

SUMMARY OF THE INVENTION

In accordance with the present invention, there is provided a passive-matrix display device, comprising:

(a) a substrate having a display area including a two-dimensional array of pixels arranged in rows and columns and located in the display area, a first layer, a second layer, a plurality of independent column electrodes in each column in the first layer, a plurality of row electrodes in the second layer, and a layer of light-emitting materials located between the first and second layers, the column electrodes and row electrodes forming pixels where the column electrodes and row electrodes overlap;

(b) a plurality of chiplets, each chiplet associated with one or more independent column electrodes located in the display area, each chiplet electrically connected to and driving a separate subset of the independent column electrodes and electrically connected to and driving a subset of the row electrodes to cause the light-emitting material in each pixel to emit light;

(c) wherein each chiplet includes a serial luminance shift register for shifting pixel luminance values corresponding to each independent column electrode from one chiplet to another and a column driver for driving each of the independent column electrodes to which it is connected with the corresponding pixel luminance values; and (d) wherein each chiplet further includes a row driver for driving each corresponding row electrode to which it is connected and a row control shift register for controlling the row drivers.

ADVANTAGES

The present invention has the advantage that chiplet pixel drivers provide improved uniformity and luminance in a display device. By providing a display device with chiplet drivers having row and column electrode connections to row and column electrodes forming pixels, the number of connection pads and the size and number of chiplets are reduced. A plurality of pixel groups provides reduced flicker and power requirements. Another advantage of the present invention is that, by employing chiplets that drive both row and column electrodes, chiplet utilization is improved and, when laid out with chiplet portions associated with rows or columns of pixel groups, wiring difficulties are reduced and aperture ratio increased. Furthermore, the distribution of heat from chiplets is improved and the number of different chiplets can be reduced.

BRIEF DESCRIPTION OF THE DRAWINGS

FIG. 11 is a cross section of a chiplet on a substrate with an electrical connection formed directly on the substrate according to an alternative embodiment of the present invention.

Figure 1:
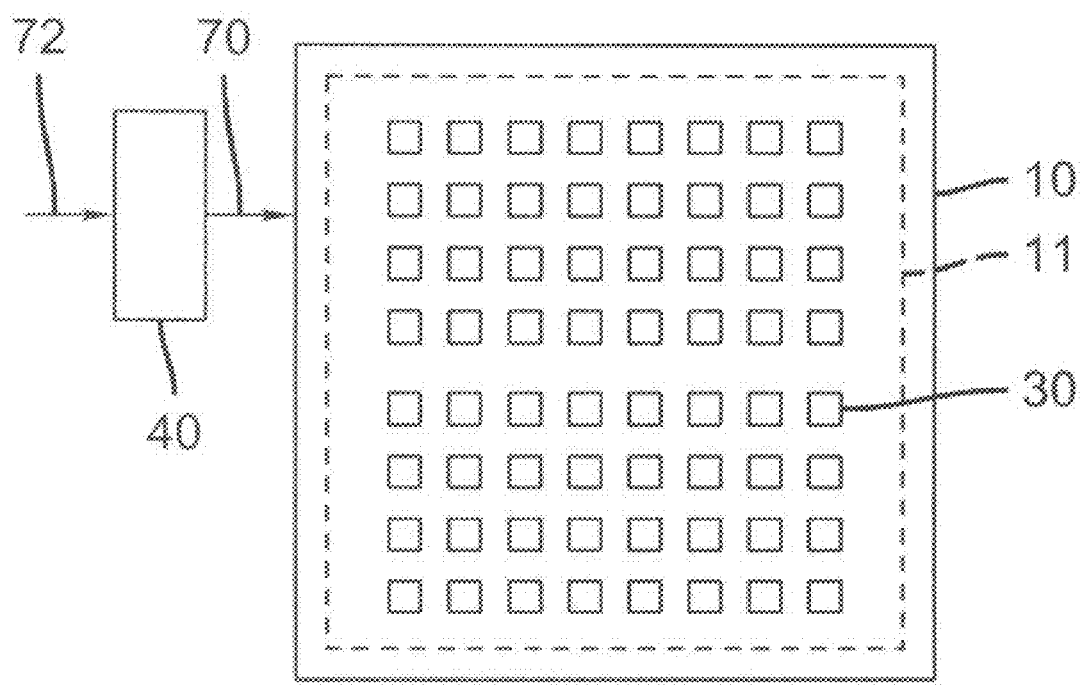
FIG. 1 is a schematic of a display system according to an embodiment of the present invention.

Because the various layers and elements in the drawings have greatly different sizes, the drawings are not to scale.

DETAILED DESCRIPTION OF THE INVENTION

Figure 2:
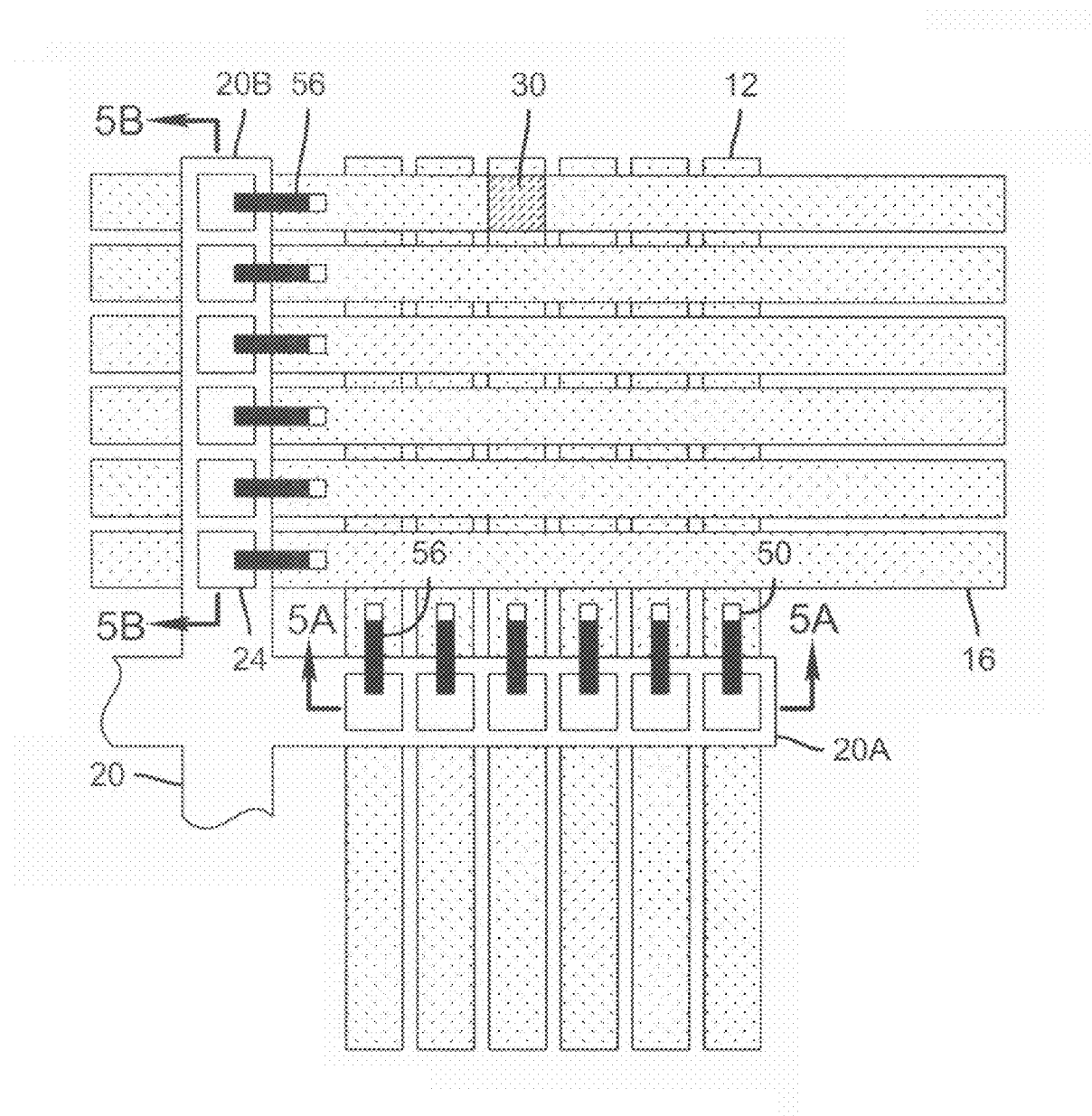
FIG. 2 is a schematic of a chiplet connected to independent column electrodes and row electrodes according to an embodiment of the present invention.
Figure 3:
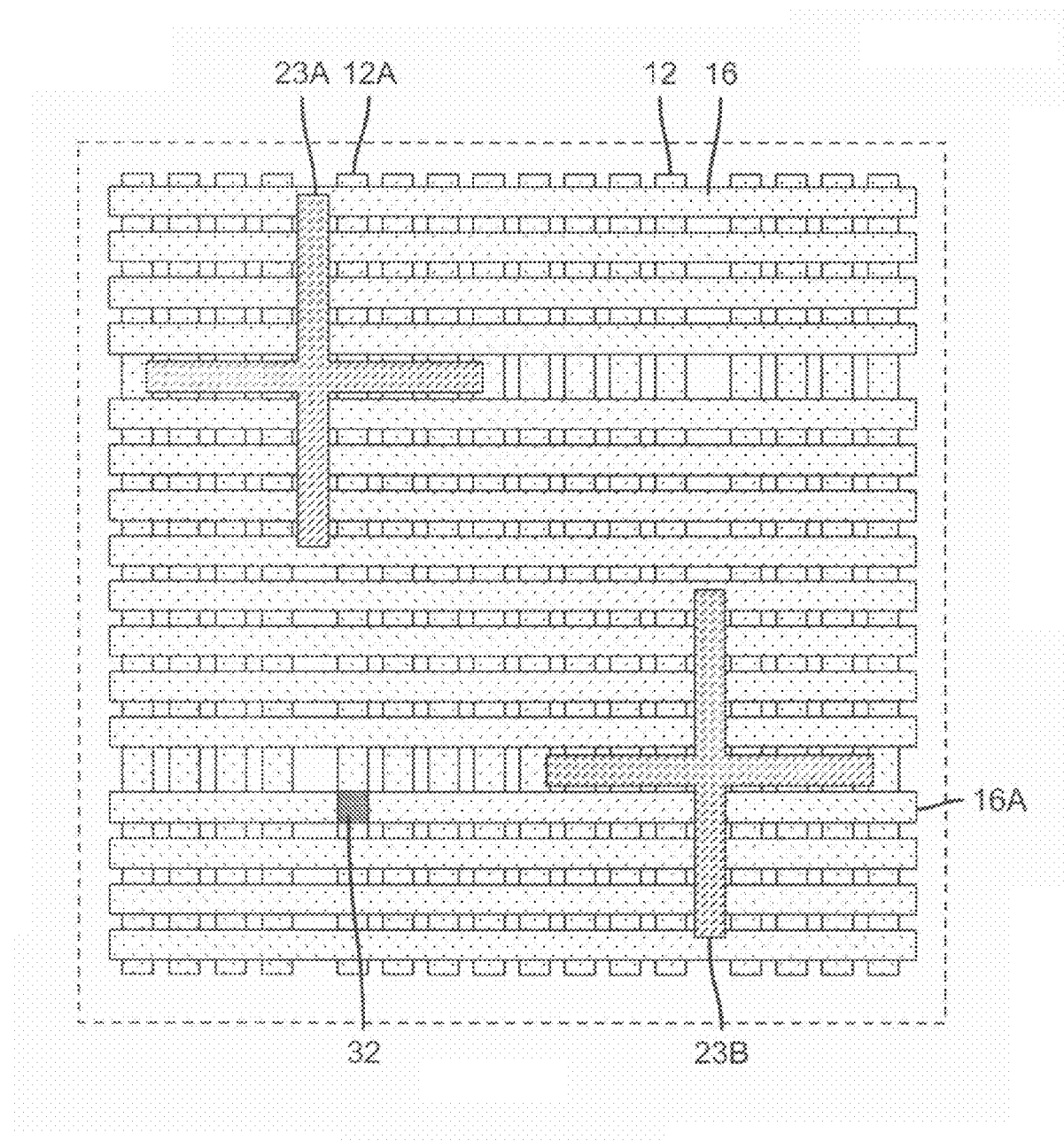
FIG. 3 is a schematic of two chiplets connected to independent column electrodes and row electrodes forming a group of passive-matrix-controlled pixels according to an embodiment of the present invention.

Referring to FIG. 1, in one embodiment of a display device according to the present invention, a substrate 10 has a display area 11 including a two-dimensional array of pixels 30 located in the display area 11. A controller 40 is connected to and can control the display device through control signals 70 in response to image signals 72. As shown in FIGS. 2 and 3, a plurality of independent column electrodes 12 extend in a column direction in a first layer, a plurality of row electrodes 16 extends in a row direction different from the column direction in a second layer. A layer of light-emitting materials is located between the first and second layers; the pixels 30 in the two-dimensional array of pixels 30 are formed where the column electrodes 12 and row electrodes 16 overlap.

Figure 8:
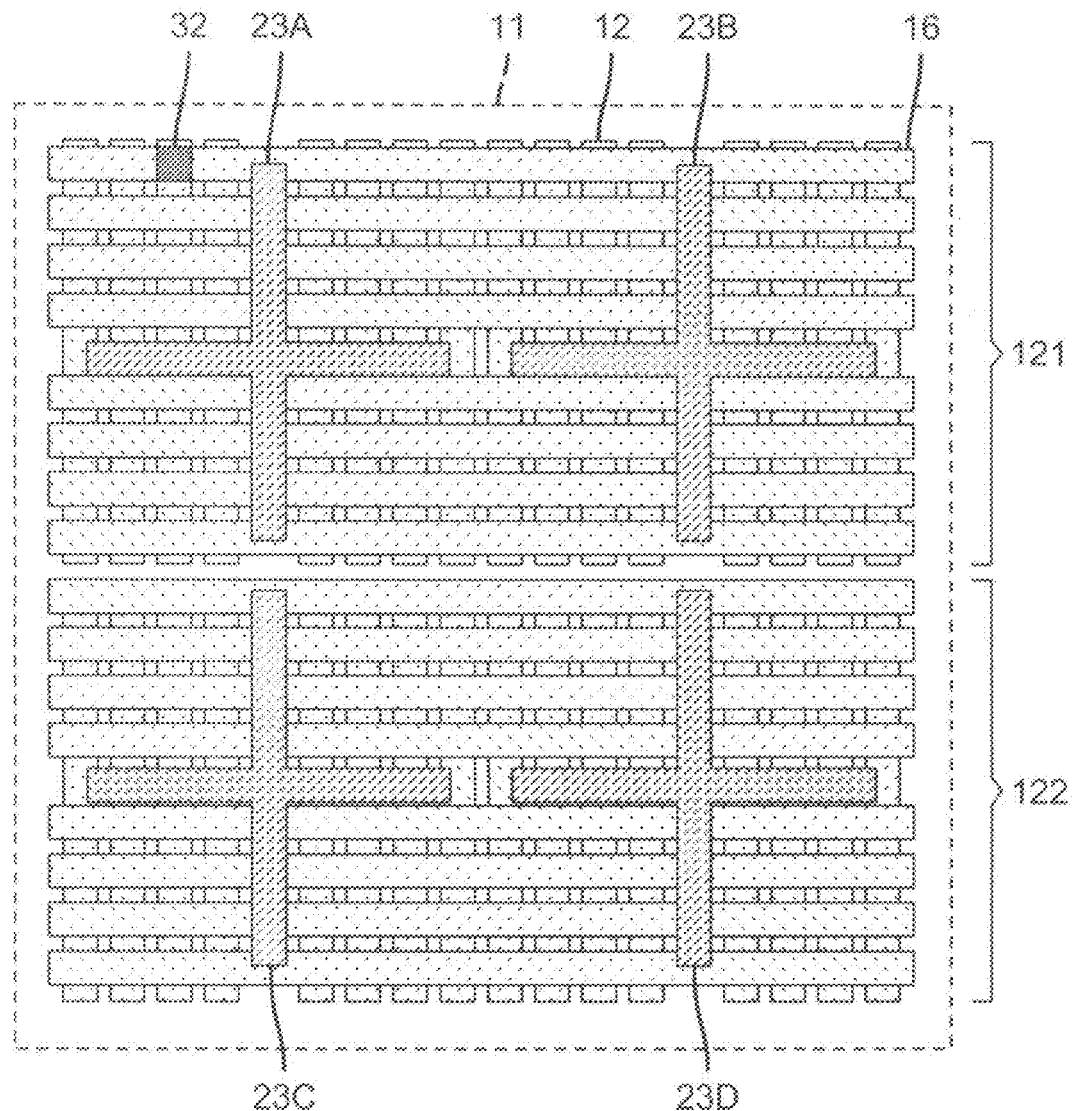
FIG. 8 is a schematic of a display device having multiple chiplets driving common row electrodes according to another embodiment of the present invention.

As used herein, a plurality of independent column electrodes 12 extending in a column direction means that the display device must have at least two electrically independent column electrodes 12 extending in the column direction in each column so that no column electrode 12 extends across the entire two-dimensional array of pixels 30 in the column direction. Therefore, according to the present invention, each column of pixels in the pixel array is driven by at least two independent column electrodes 12 and a display device according to the present invention cannot have fewer than two independent column electrodes 12 in the column direction. FIG. 8 illustrates at least two independent column electrodes 12 extending in the column direction in each column. Common row electrodes common to an independent column electrode are those row electrodes that are electrically connected (through a light-emitting layer 14) to the independent column electrode.

One or more chiplets 20 in display area 11, each chiplet 20 electrically connected to one or more independent column electrodes 12 through connection pads 24, is located in, or adjacent to, the display area 11. By independent column electrodes is meant that each column electrode 12 is connected to, and driven by, only one chiplet 20. Each chiplet 20 is electrically connected to and drives a separate subset of the independent column electrodes 12 and is electrically connected to and drives a subset of the row electrodes 16 (shown on FIGS. 5A and 5B) to cause the light-emitting material 14 in each pixel 30 to emit light. In FIG. 2, a schematic of a portion of the display area, the chiplet 20 is shown above the row 16 (shown on FIGS. 5A and 5B) and column 12 electrodes for clarity; in practice the chiplet 20 can be beneath the electrodes 12, 16 and connected either directly to the electrodes 12, 16 (shown on FIGS. 5A and 5B) or through an electrical connection 56 and a via 50, as shown. Some of the column electrodes 16 and row electrodes 12 are omitted from FIG. 2 for clarity. In FIG. 2, the chiplets are shown with a connection pad 24 pitch identical to that of the electrodes, 12, 16. While such an arrangement can be advantageous in minimizing electrical connections 56, such an arrangement can lead to larger chiplets 20 than can be desired. In an alternative embodiment, such as that of FIG. 3, electrical connections must be routed from the connection pads to the electrodes over longer relative distances. In FIG. 3, the connection pads and electrical wires are omitted for clarity. The present invention can be applied to both top- and bottom-emitting configurations. Bottom-emitting configurations can be simpler to construct, but top-emitting configurations can have improved aperture ratios by locating chiplets beneath pixels. A pixel that is common to two chiplets is a pixel whose row electrode is electrically connected to a first chiplet and whose independent column electrode is electrically connected to a second chiplet different from the first chiplet.

Figure 4A:
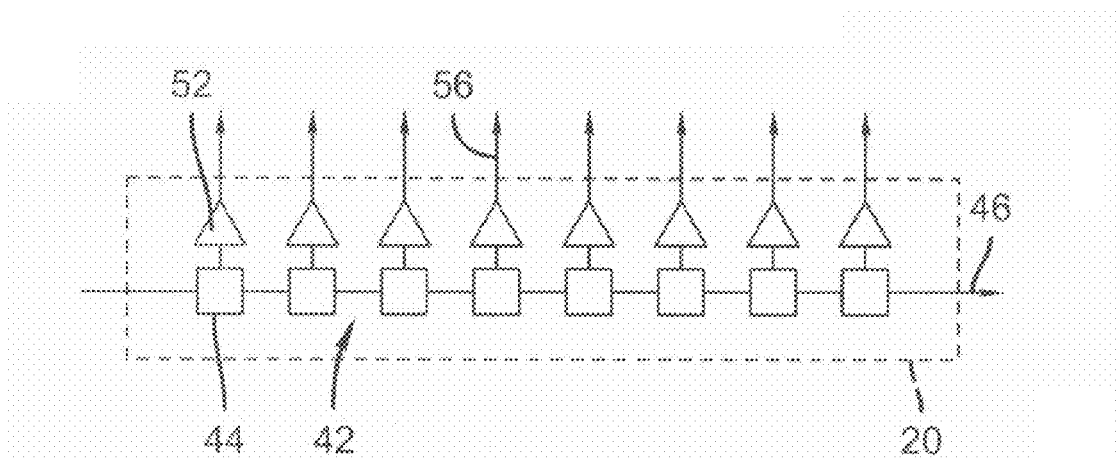
FIG. 4A is a schematic of column driver circuitry in a chiplet according to an embodiment of the present invention.

Referring to FIG. 4A, each chiplet 20 includes a serial luminance shift register 42 for shifting pixel luminance values corresponding to each independent column electrode from one chiplet 20 to another through individual registers 44 and includes column drivers 52 for driving the independent column electrodes with the pixel luminance values from the individual registers 44 through an electrical connection 56. Each register in the serial luminance shift register can have input and an output serial luminance shift register signals 46, the first register in the series in each chiplet can have an external input and the last register in the series in each chiplet can drive an output signal from the chiplet. The output of the serial luminance shift register of a first chiplet can be connected to the input of the serial luminance shift register of a second chiplet to form a larger serial luminance shift register. Chiplets connected in this fashion can be located as neighbors in a common chiplet row in the display area.

Figure 4B:
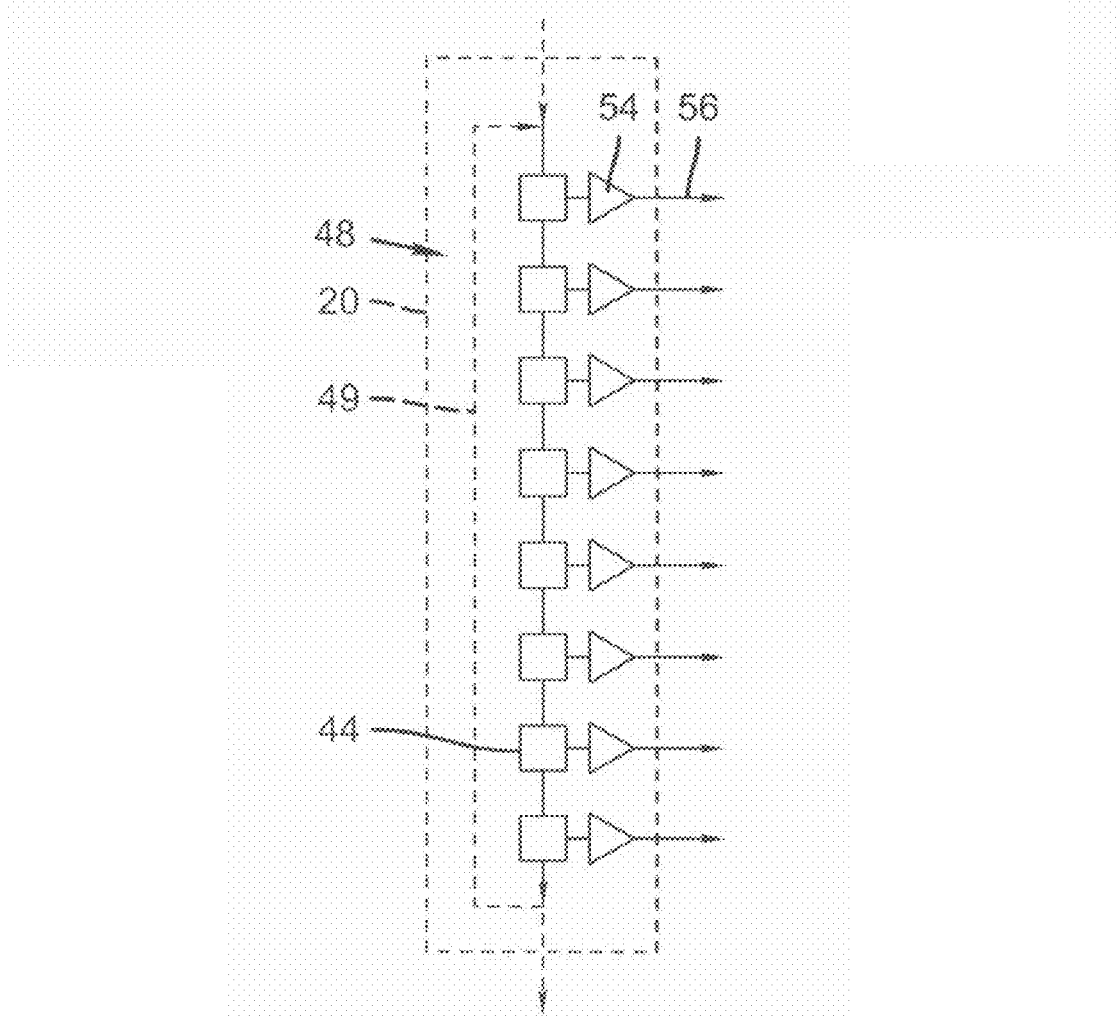
FIG. 4B is a schematic of row driver circuitry in a chiplet according to an embodiment of the present invention.

The luminance values may be analog and the individual registers 44 may store analog values, e.g. as charge. Referring to FIG. 4B, each chiplet 20 also includes a row control shift register 48 for serially shifting a row control signal 49 through individual serial shift registers 44. In one embodiment of the present invention, the row control signal 49 is digital and the individual shift registers are flip-flops. Each register in the row control shift register has an input and an output; the first register in the series in each chiplet can have an external input and the last register in the series in each chiplet can drive an output signal from the chiplet. The row control signal 49 enables a single row driver 54 at a time to drive a row electrode through an electrical connection 56. The row control signal 49 may be a rotary signal that passes through the individual shift registers to the last register in the row control shift register and then is transferred to the first register in the row control shift register. The row control shift register may be contained completely within a single chiplet or the series may include multiple chiplets. In the latter case, a signal line must be employed to transfer the row control signal 49 from the last chiplet in the series to the first chiplet in the series. Alternatively, an external signal may reset the row control signal 49 and the row control shift register 48 need not be rotary.

Figure 5A:
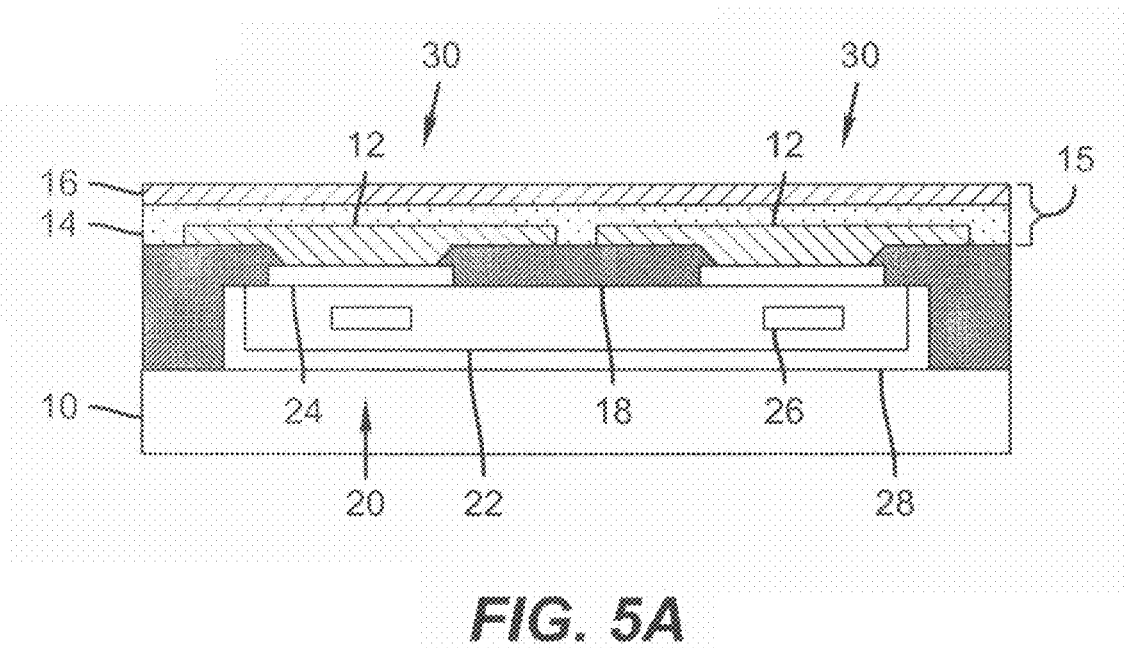
FIG. 5A is a schematic of column driver circuitry in a chiplet according to an embodiment of the present invention.
Figure 5B:
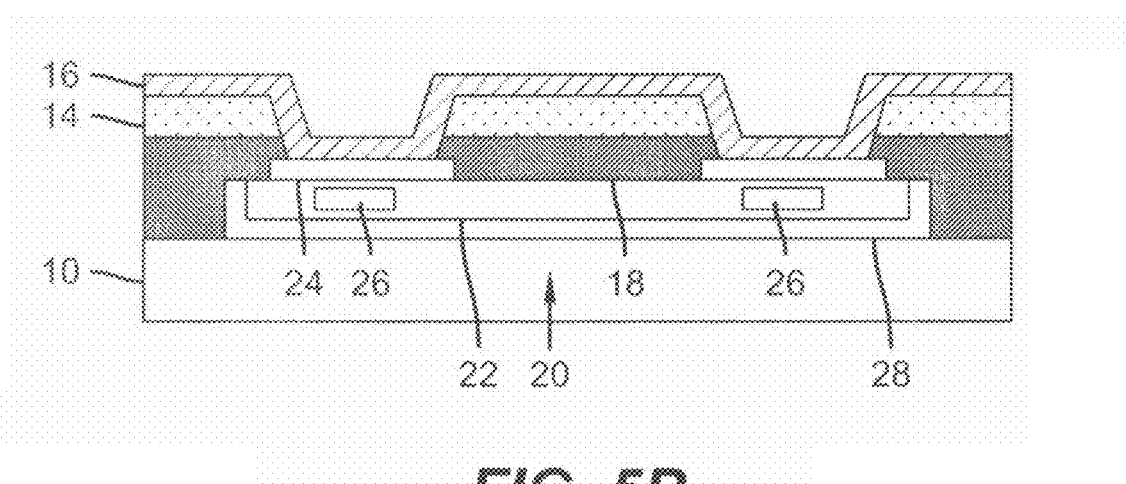
FIG. 5B is a cross section of row driver circuitry in a chiplet according to an embodiment of the present invention.

FIG. 5A is a cross section of FIG. 2 taken along line 5A. FIG. 5B is a cross section of FIG. 2 taken along line 5B. Referring to FIGS. 5A and 5B, in one embodiment, the present invention includes a display device including a substrate 10, a first layer having an array of row electrodes 16 formed in rows across the substrate 10 in a first direction and a second layer having an array of column electrodes 12 formed in columns across the substrate 10 in a second direction different from the first direction and wherein the first and second electrodes overlap in pixel locations to form pixels 30. One or more layers of light-emitting material 14 are formed between the row and column electrodes 16, 12. Light-emitting diodes 15 are pixels 30 that form a two-dimensional array of pixels 30 in the pixel locations and emit light when a current is passed through the light-emitting layer 14 from the row and column electrodes 16, 12. A plurality of chiplets 20 is located over the substrate 10, the number of chiplets 20 being less than the number of pixels 30, each chiplet 20 exclusively controlling a subset of independent column electrodes 12. Row electrodes 16 are also chiplet-controlled but multiple chiplets 20 can control row electrodes 16 in common so that the pixels 30 are controlled to display an image. Each chiplet 20 has a chiplet substrate 28 that is independent and separate from the display device substrate 10. In this disclosure, a pixel 30, sub-pixel, and light-emitting element all refer to a light-emitting diode 15 that emits light upon the application of current from a row electrode 16 and an independent column electrode 12.

Each chiplet 20 can include circuitry 22 for controlling the pixels 30 to which the chiplet 20 is connected through connection pads 24. The circuitry 22 can include storage elements 26 (e.g. registers) that store a value representing a desired luminance for each pixel 30 to which the chiplet 20 is connected in a subset row or column, the chiplet 20 using such value to control the row electrodes 16 or independent column electrodes 12 connected to the pixel 30, to activate the pixel 30 to emit light. For example, if a chiplet 20 is connected to a subset of 8 rows and 8 columns, eight storage elements 26 can be employed to store luminance information for eight columns. Each time a new row is activated, a new subset of luminance information can be supplied to the chiplet 20 for each column. In one embodiment of the present invention, two storage elements 26 can be employed for each subset column, so that luminance information can be stored in one of the storage elements 26 while the other storage element 26 is employed to display luminance information. In yet another embodiment of the present invention, one or two storage elements 26 can be employed for each light-emitting element 30 to which the chiplet 20 is connected.

A planarization layer 18 can be employed to form a smooth surface over which the row and column electrodes 16, 12, and the light-emitting layer 14 can be formed. Connection pads 24 of the chiplet 20 can connect to the bottom electrode of the light-emitting diode 15, here shown as the column electrode 12 in FIG. 5A. Alternatively, as shown in FIG. 5B, the connection pads 24 of the chiplet 20 can connect to the top electrode of the light-emitting diode, here shown as the row electrode 16. In this way, the connection pads 24 of chiplet 20 can connect to either row electrodes 16 or column electrodes 12. (The use of "row" and "column" descriptors is arbitrary and can be reversed, if desired. As used herein, a column electrode 12 is driven uniquely by one chiplet independently of any other chiplet or column electrode, typically with a current corresponding to a desired luminance value, while the row electrodes 16 can be connected in common and shared among several chiplets 20 or can be connected in common across the entire display area.)

Figure 6:
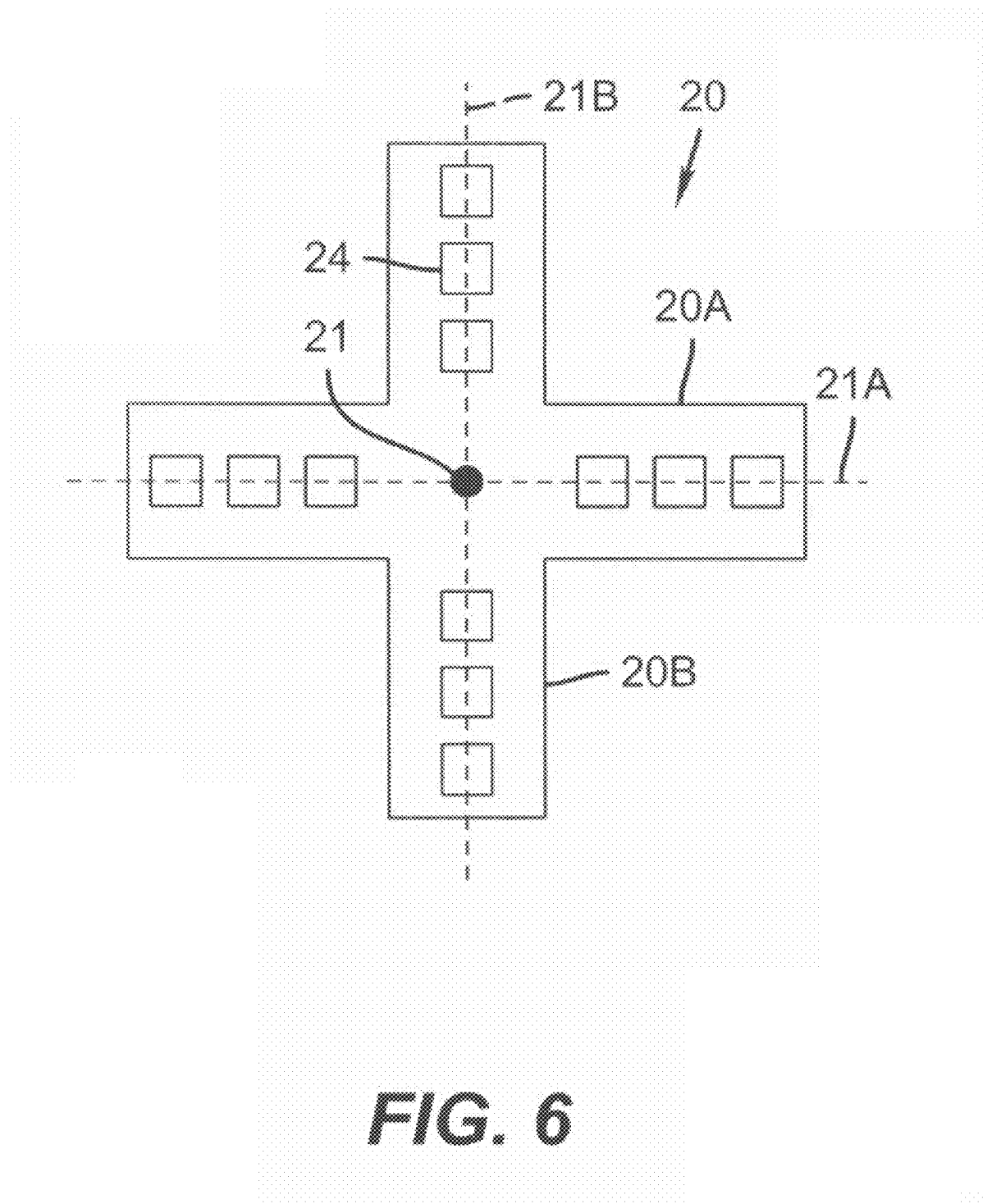
FIG. 6 is a schematic of a chiplet according to another embodiment of the present invention.

In one embodiment of the present invention, referring to FIG. 6, each chiplet 20 can have at least first and second chiplet portions 20A, 20B extending in different directions from a common point 21 on the chiplet 20. The first and second portions can be arms, for example of a '+' sign (the '+' symbol is often used to represent addition in mathematical notation). (An 'x' character can also be considered to be a rotated '+' sign.) The first chiplet portion 20A can have a first axis 21A extending in a first direction and the second chiplet portion 20B can have having a second axis 21B extending in a second direction different from the first direction. The different directions can be orthogonal, as can the directions of the row and column electrodes in the display area. Either of the first or second axes can extend in a direction parallel to the row direction or the column direction.

As shown in FIGS. 2 and 6, chiplet portion 20A can include connection pads 24 electrically connected to column electrodes and chiplet portion 20B can include connection pads 24 electrically connected to row electrodes. Such a chiplet shape and connection pad arrangement can facilitate efficient layout of electrical connections in the display area and increase the area in the display area used to emit light, improving display life time and image quality. While the connection pads 24 of FIGS. 2 and 6 are illustrated in a single row, in alternative embodiments of the present invention connection pads can be arranged in multiple rows along the length of the chiplet, for example in two rows (FIG. 7).

The present invention provides a means to independently control multiple groups of pixels in separate passive-matrix pixel groups. Since each of the pixel groups can be controlled simultaneously, the problems of passive-matrix-controlled display devices found in the prior art (e.g. flicker, large electrode impedance, and high currents) can be mitigated through a reduced number of rows in a pixel group and reduce electrode size. The row and column electrodes 16, 12 of the present invention can be connected in different configurations to different chiplets in various embodiments of the present invention to provide different arrangements of passive-matrix-controlled pixel groups.

Figure 7:
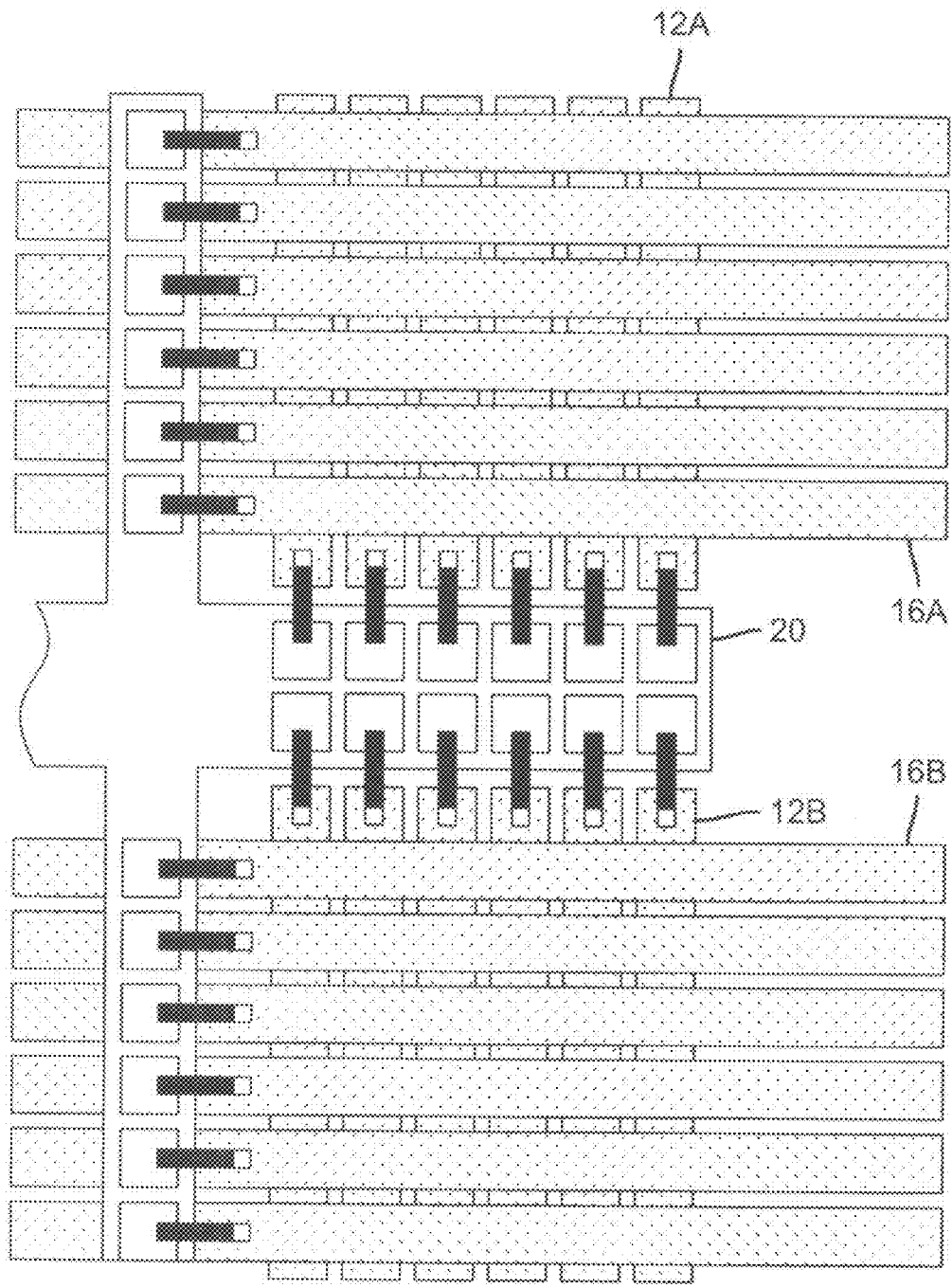
FIG. 7 is a schematic of a chiplet having two rows of connection pads connected to independent column electrodes and a row of connection pads connected to row electrodes according to an embodiment of the present invention.

Referring to FIG. 7, according to an embodiment of the present invention, one chiplet 20 can drive one or more first independent column electrodes 12A having a first set of common row electrodes 16A and the same chiplet 20 can drive one or more second independent column electrodes 12B different from the first set of independent column electrodes 12A having a second set of common row electrodes 16B different from the first set of common row electrodes 16A. Such an arrangement can utilize the chiplets and display area more effectively.

In the embodiment of FIG. 3, a chiplet 23A drives an independent column electrode 12A of a pixel 32 and a different chiplet 23B drives the row electrode 16A of the same pixel 32. The chiplets 23A and 23B can be controlled so that only one of the row electrodes 16 connected to the chiplets 23A and 23B are activated at a time, using a common row control signal (not shown in FIG. 3), while all of the column electrodes 12 can be activated simultaneously, thereby increasing the size of the passive-matrix pixel group and decreasing the number of chiplets needed. In FIG. 3, each of the two chiplets controls the eight column electrodes and eight row electrodes closest to it to form a 16-by-16 passive-matrix-controlled pixel group. In this arrangement, the chiplets 23A and 23B control some of the pixels together, for example chiplet 23A controls the column electrode and chiplet 23B controls the row electrode for pixel 32.

In an alternative embodiment shown in FIG. 8, two chiplets 23A, 23B drive adjacent independent column electrodes 12 and commonly drive row electrodes 16. Likewise, two chiplets 23C, 23D drive adjacent independent column electrodes 12 and commonly drive row electrodes 16. In this configuration, flicker is reduced because the number of rows in each passive-matrix-controlled group is reduced (from 16 to 8) and two sets of independent column electrodes 12 are employed in the column direction. The top 8 rows are driven independently from the bottom 8 rows. Therefore, data signals can propagate simultaneously and independently in chiplets 23A, 23B and in chiplets 23C, 23D and the two sets of column electrodes 121, 122 can be driven independently and simultaneously. Moreover, the row current driven by each chiplet 23A, 23B, 23C, and 23D is reduced since two chiplets 23A and 23B or 23C and 23D are connected in parallel to each row electrode 16.

The chiplets can be located in a chiplet array of chiplet rows and chiplet columns. In FIG. 3, chiplets 23A, 23B controlling common pixels are in different rows and different columns and not every point in the chiplet array has a chiplet located there. Hence, in this embodiment, the chiplets 20 that drive common pixels 32 are located on a diagonal with respect to the row electrodes 16 and with respect to the independent column electrodes 12 and to the array of pixels defined by the row and column electrodes 16, 12. In FIG. 8, chiplets 23A, 23B, 23C, 23D are located at every point in the chiplet array.

Figure 9:
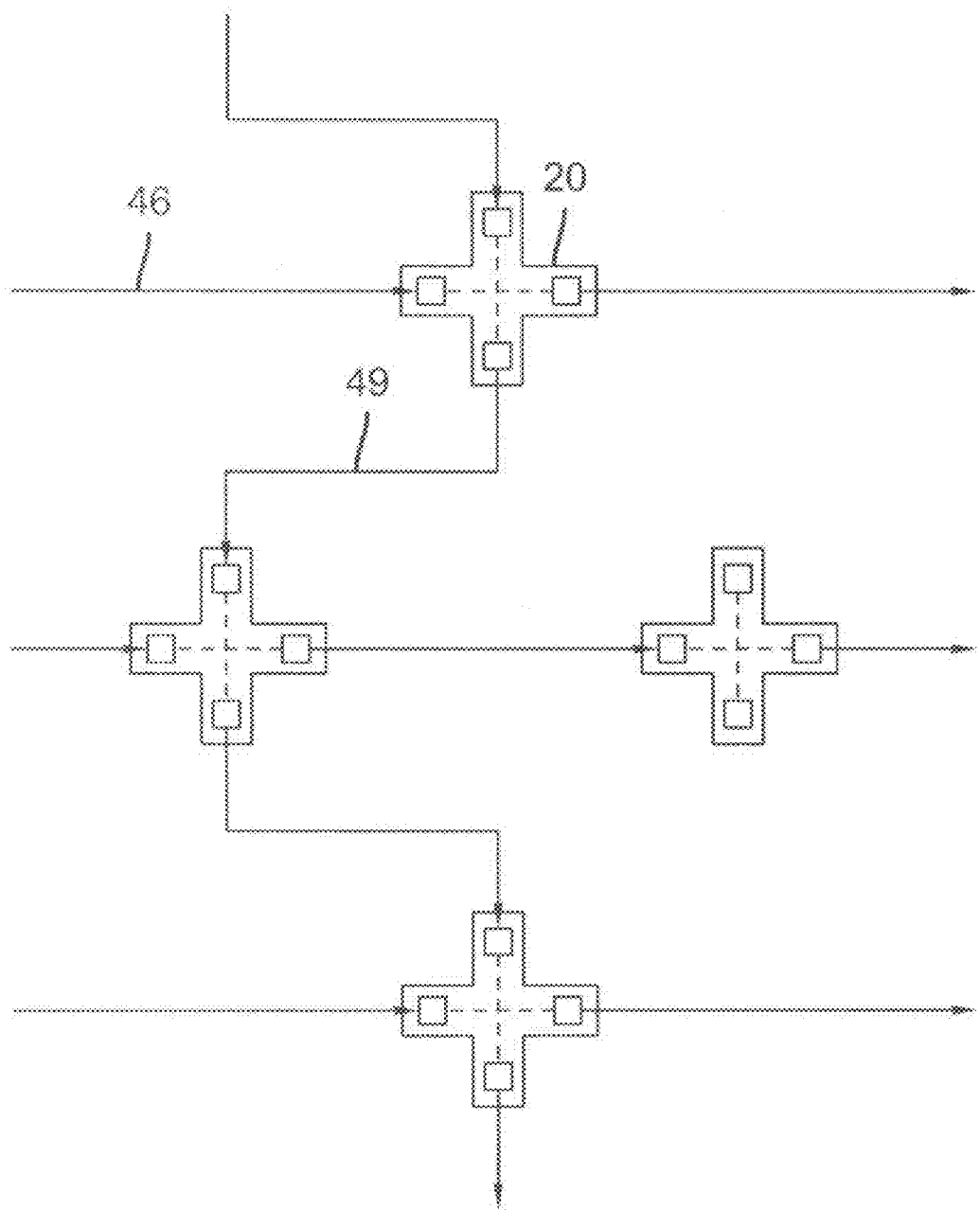
FIG. 9 is a schematic of a display device having multiple chiplets connected by signals according to another embodiment of the present invention.
Figure 10:
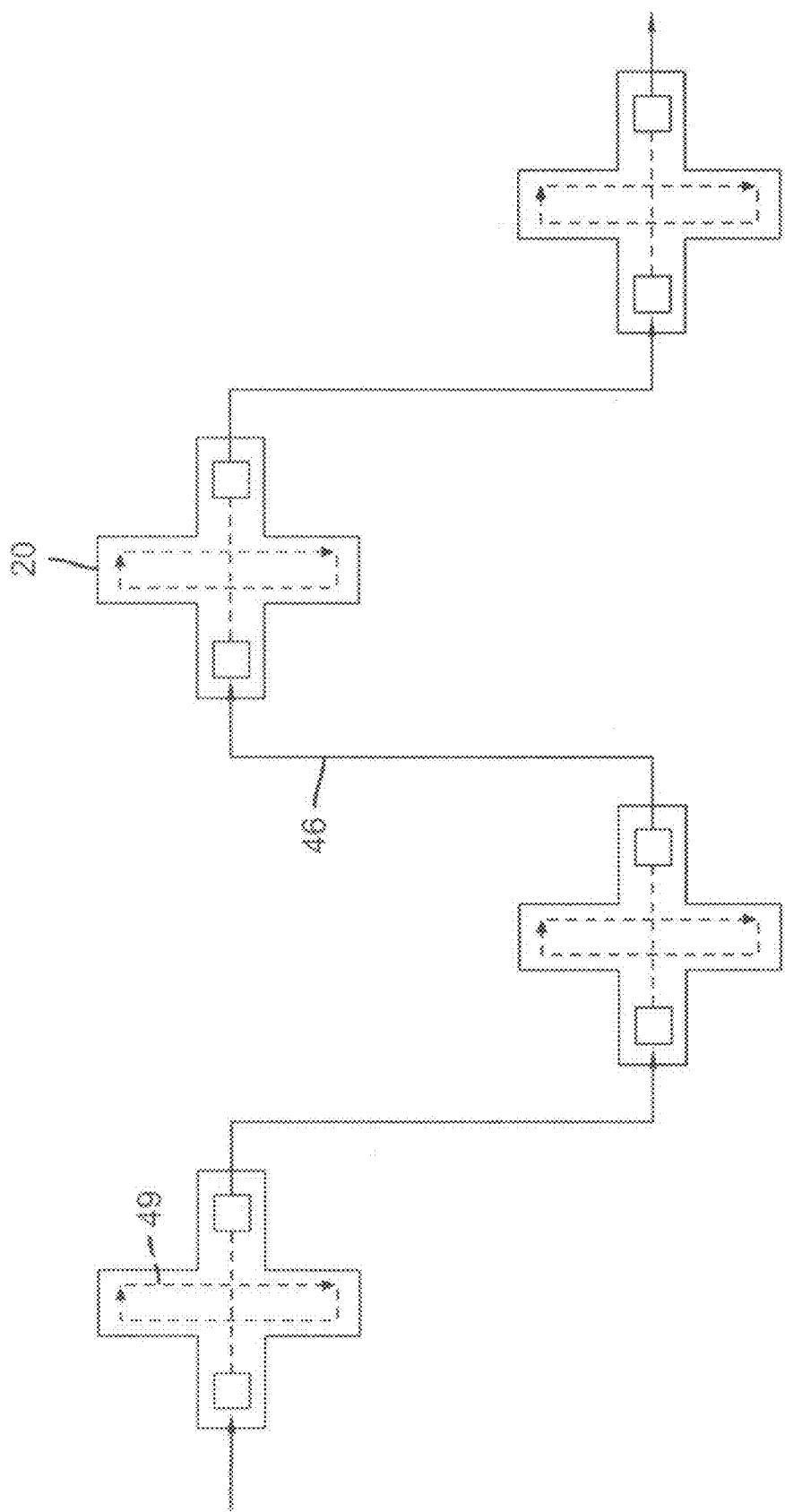
FIG. 10 is a schematic of a display device having multiple chiplets connected by signals according to another embodiment of the present invention.

Referring to FIG. 9, the chiplets 20 can be connected with either or both the serial luminance shift register signal 46 and the row control signal 49. The serial luminance shift register shifts data values (for example charges stored in capacitors) specifying a desired luminance for a row of pixels and driven by the column drivers onto the independent column electrodes. The row control signal 49 controls which row is activated. This signal can pass from chiplet to chiplet in a single passive-matrix controlled pixel group (e.g. as in FIG. 3). If a single chiplet, or group of chiplets connected in parallel to the same row electrodes, controls all of the rows in a passive-matrix controlled pixel group, there is no need to propagate the row control signal 49 from one chiplet to another and the row control signal 49 is kept within each of the single chiplets connected in common to the same row electrodes (as in FIG. 10). In FIG. 10, all of the chiplets 20 in a common passive-matrix controlled pixel group are serially connected with the serial luminance shift register signal 46, even if they are not in a common chiplet row. The row control signal 49 is not propagated from chiplet to chiplet. Alternatively, and as shown in FIG. 9, only chiplets in a common chiplet row can be serially connected with the serial luminance shift register signal 46 (in which case the data must be reorganized to match the ordering of the chiplet-controlled independent column electrodes. In the embodiment of FIG. 9, the row control signal 49 is propagated from chiplet to chiplet. As shown in FIG. 11, electrical signals can be propagated through substrate wires 47 formed directly on the substrate 10 to chiplet 20 through connection pad 24. The substrate wires 47 enable improved routing and layout over the substrate 10.

If the chiplet arrangement of FIG. 8 is employed, all of the signal lines connecting the chiplets in the display area can extend in a straight line from chiplet to chiplet. The signal lines can pass though the chiplets to improve routing. Alternatively, in the embodiments of FIGS. 3, 9, and 10, one or more of the signal lines can extend to a first chiplet in a first direction, pass through the first chiplet, and extend to a second chiplet in a second direction different from the first direction.

In operation, the controller receives an image signal and drives the display device with control signals that transfer pixel signals to each chiplet and provide timing signals to control the row electrodes. The control signals can include clock and reset signals, for example, and also include data signals (for example, in the form of a charge) corresponding to a desired luminance value for each pixel. The data signals can be serially shifted through the chiplets, in one or more separate, serially connected set of chiplets until all of the chiplets have data values corresponding to a desired luminance value for each of the independent column electrodes connected to the chiplet. Once the data values are loaded into the chiplets, the chiplet column drives can drive the column electrodes with the values at the same time as a row driver activates the row electrodes corresponding to the pixels that are to emit light. The process is repeated until each row of pixels in a commonly controlled passive-matrix pixel group has been driven. The row control signal can sequentially enable each row of electrodes. Once all of the pixels have been activated, the process repeats.

Commonly assigned, co-pending application Ser. No. 12/372,906, which is hereby incorporated by reference, provides more detail on control methods for passive-matrix-controlled pixel groups. Commonly assigned, co-pending application Ser. No. 12/424,060, which is hereby incorporated by reference, provides more detail on chiplets arrangements, while commonly assigned, co-pending application Ser. No. 12/371,666, which is hereby incorporated by reference, provides more detail on circuits that can be employed to shift data values and control row and column electrodes in passive-matrix-controlled pixel groups. Commonly assigned, co-pending application Ser. No. 12/431,925, which is hereby incorporated by reference, provides more detail on signal layout and routing for chiplet-based displays.

The present invention provides reduced costs over the prior art. For example, if a conventional, active-matrix backplane were employed to drive the 256 pixels 32 of FIG. 3, a relatively low-performance and expensive thin-film semiconductor backplane would be necessary. The present invention instead employs a few high-performance, inexpensive chiplets to drive the pixels 30. Furthermore, if a conventional active-matrix control structure were employed with chiplets having the same number of connection pads as those of FIG. 3, 32 chiplets would be needed, rather than the two illustrated.

Signals can include timing (e.g. clock) signals, data signals, select signals, power connections, or ground connections. The signals can be analog or digital, for example digital addresses or data values. Analog data values can be supplied as charge. The storage elements can be digital (for example including flip-flops) or analog (for example including capacitors for storing charge).

In various embodiments of the present invention, the chiplets distributed over the substrate can be identical. However, a unique identifying value, i.e. an ID, can be associated with each chiplet. The ID can be assigned before or, preferably, after the chiplet is located over the substrate and the ID can reflect the relative position of the chiplet on the substrate, that is, the ID can be an address. For example, the ID can be assigned by passing a count signal from one chiplet to the next in a row or column. Separate row or column ID values can be used.

The controller can be implemented as a chiplet and affixed to the substrate. The controller can be located on the periphery of the substrate, or can be external to the substrate and include a conventional integrated circuit.

According to various embodiments of the present invention, the chiplets can be constructed in a variety of ways, for example with one or two rows of connection pads along a long dimension of a chiplet. The signal lines and electrical connections can be formed from various materials and can use various methods for deposition on the device substrate. For example, the signal lines and electrical connections can be metal, either evaporated or sputtered, for example aluminum or aluminum alloys. Alternatively, the signal lines and electrical connections can be made of cured conductive inks or metal oxides. In one cost-advantaged embodiment, the signal lines and electrical connections, or both, are formed in a single layer.

The present invention is particularly useful for multi-pixel device embodiments employing a large device substrate, e.g. glass, plastic, or foil, with a plurality of chiplets arranged in a regular arrangement over the device substrate. Each chiplet can control a plurality of pixels formed over the device substrate according to the circuitry in the chiplet and in response to control signals. Individual pixel groups or multiple pixel groups can be located on tiled elements, which can be assembled to form the entire display.

According to the present invention, chiplets provide distributed pixel control elements over a substrate. A chiplet is a relatively small integrated circuit compared to the device substrate and includes a circuit including wires, connection pads, passive components such as resistors or capacitors, or active components such as transistors or diodes, formed on an independent substrate from the display device substrate. Chiplets having an independent substrate are separately manufactured from the display substrate and then applied to the display substrate. The chiplets are preferably manufactured using silicon or silicon on insulator (SOI) wafers using known processes for fabricating semiconductor devices. Each chiplet is then separated prior to attachment to the device substrate. The crystalline base of each chiplet can therefore be considered an independent substrate separate from the device substrate and over which the chiplet's circuitry is disposed. The plurality of chiplets therefore has a corresponding plurality of independent substrates separate from the device substrate and each other. In particular, the independent substrates are separate from the substrate on which the pixels are formed and the areas of the independent, chiplet substrates, taken together, are smaller than the device substrate. Chiplets can have a crystalline substrate to provide higher performance active components than are found in, for example, thin-film amorphous or polycrystalline silicon devices. Chiplets can have a thickness preferably of 100 um or less, and more preferably 20 um or less. This facilitates formation of the adhesive and planarization material over the chiplet that can then be applied using conventional spin-coating techniques. According to one embodiment of the present invention, chiplets formed on crystalline silicon substrate are arranged in a geometric array and adhered to a device substrate with adhesion or planarization materials. Connection pads on the surface of the chiplets are employed to connect each chiplet to signal wires, power busses and row or column electrodes to drive pixels. Chiplets can control at least four pixels.

Since the chiplets are formed in a semiconductor substrate, the circuitry of the chiplet can be formed using modern lithography tools. With such tools, feature sizes of 0.5 microns or less are readily available. For example, modern semiconductor fabrication lines can achieve line widths of 90 nm or 45 nm and can be employed in making the chiplets of the present invention. The chiplet, however, also requires connection pads for making electrical connection to the wiring layer provided over the chiplets once assembled onto the display substrate. The connection pads are sized based on the feature size of the lithography tools used on the display substrate (for example 5 um) and the alignment of the chiplets to the wiring layer (for example +/−5 um). Therefore, the connection pads can be, for example, 15 um wide with 5 um spaces between the pads. This means that the pads will generally be significantly larger than the transistor circuitry formed in the chiplet.

The pads can generally be formed in a metallization layer on the chiplet over the transistors. It is desirable to make the chiplet with as small a surface area as possible to enable a low manufacturing cost. Therefore, the size and number of the connection pads and not the transistors will generally limit the size of the chiplet.

By employing chiplets with independent substrates (e.g. including crystalline silicon) having circuitry with higher performance than circuits formed directly on the substrate (e.g. amorphous or polycrystalline silicon), a device with higher performance is provided. Since crystalline silicon has not only higher performance but much smaller active elements (e.g. transistors), the circuitry size is much reduced so that the chiplet size can be determined by the number and spacing of connection pads necessary to control and power the device. A useful chiplet can also be formed using micro-electro-mechanical (MEMS) structures, for example as described in "A novel use of MEMS switches in driving AMOLED", by Yoon, Lee, Yang, and Jang, Digest of Technical Papers of the Society for Information Display, 2008, 3.4, p. 13.

The device substrate can include glass and the wiring layers made of evaporated or sputtered metal, e.g. aluminum or silver, formed over a planarization layer (e.g. resin) patterned with photolithographic techniques known in the art. The chiplets can be formed using conventional techniques well established in the integrated circuit industry.

The present invention can be employed in devices having a multi-pixel infrastructure. In particular, the present invention can be practiced with LED devices, either organic or inorganic, and is particularly useful in information-display devices. In a preferred embodiment, the present invention is employed in a flat-panel OLED device composed of small-molecule or polymeric OLEDs as disclosed in, but not limited to U.S. Pat. No. 4,769,292 to Tang et al., and U.S. Pat. No. 5,061,569 to VanSlyke et al. Inorganic devices, for example, employing quantum dots formed in a polycrystalline semiconductor matrix (for example, as taught in U.S. Patent Application Publication No. 2007/0057263 by Kahen), and employing organic or inorganic charge-control layers, or hybrid organic/inorganic devices can be employed. Many combinations and variations of organic or inorganic light-emitting displays can be used to fabricate such a device, including active-matrix displays having either a top- or a bottom-emitter architecture.

The invention has been described in detail with particular reference to certain preferred embodiments thereof, but it should be understood that variations and modifications can be effected within the spirit and scope of the invention.

PARTS LIST 5A cross section line
5B cross section line
10 substrate
11 display area
12 column electrode
12A column electrodes
12B column electrodes
14 light-emitting material
15 light-emitting diode
16 row electrode
16A row electrode
16B row electrode
18 planarization layer
20 chiplet
20A chiplet portion
20B chiplet portion
21 common chiplet point
21A first axis
21B second axis
22 circuitry
23A chiplet
23B chiplet
23C chiplet
23D chiplet
24 connection pad
26 storage element
28 chiplet substrate
30 pixel
32 pixel
40 controller
42 serial luminance shift register
44 serial shift register
46 serial luminance shift register signal
47 substrate wire
48 row control shift register
49 row control signal
50 via
52 column driver
54 row driver
56 electrical connection
70 control signals
72 image signal
121 column electrode set
122 column electrode set

The invention claimed is:
1. A passive-matrix display device, comprising:
(a) a substrate having a display area including a two-dimensional array of pixels arranged in rows and columns and located in the display area, a first layer, a second layer, a plurality of independent column electrodes in each column in the first layer, a plurality of row electrodes in the second layer, and a layer of light-emitting materials located between the first and second layers, the column electrodes and row electrodes forming pixels where the column electrodes and row electrodes overlap;
(b) a plurality of chiplets, each chiplet associated with one or more independent column electrodes located in the display area, each chiplet electrically connected to and driving a separate subset of the independent column electrodes and electrically connected to and driving a subset of the row electrodes to cause the light-emitting material in each pixel to emit light;

(c) wherein each chiplet includes a serial luminance shift register for shifting pixel luminance values corresponding to each independent column electrode from one chiplet to another and a column driver for driving each of the independent column electrodes to which it is connected with the corresponding pixel luminance values; and (d) wherein each chiplet further includes a row driver for driving each corresponding row electrode to which it is connected and a row control shift register for controlling the row drivers.

2. The display device of claim 1 wherein each chiplet has a common point and first and second chiplet portions extending in different directions from the common point on the chiplet.

3. The display device of claim 2 wherein the chiplets have a '+' shape with the first chiplet portion having a first axis extending in a first direction and the second chiplet portion having a second axis extending in a second direction different from the first direction.

4. The display device of claim 3 wherein the first axis extends in a direction parallel to the row direction or the column direction.

5. The display device of claim 3 further comprising connection pads on each chiplet portion and wherein the connection pads on the first chiplet portion are connected to row electrodes and the connection pads on the second chiplet portion are connected to column electrodes.

6. The display device of claim 1 wherein one chiplet drives one or more first independent column electrode(s) connected with a first set of common row electrodes and wherein the chiplet also drives one or more second independent column electrode(s) different from the first independent column electrode(s), the one or more second independent column electrode(s) being connected with a second set of common row electrodes different from the first set of common row electrodes.

7. The display device of claim 1 wherein a first chiplet drives an independent column electrode of a pixel and a different second chiplet drives the row electrode of the same pixel.

8. The display device of claim 1 wherein the chiplets are located in chiplet rows and chiplet columns.

9. The display device of claim 8 wherein the chiplets driving common pixels are in different chiplet rows and different chiplet columns.

10. The display device of claim 8 wherein each serial luminance shift register has an input and an output and the output of the serial luminance shift register of a first chiplet in a chiplet row is connected to the input of the serial luminance shift register of a second chiplet in the same chiplet row.

11. The display device of claim 1 wherein chiplets are located on a diagonal to the row electrodes and to the independent column electrodes.

12. The display device of claim 11 wherein the row and column electrodes associated with a pixel are driven by two chiplets.

13. The display device of claim 1 wherein at least one row electrode is electrically connected in parallel to two or more chiplets.

14. The display device of claim 1 wherein each row driver includes a serial row shift register having an input and an output and the output of the serial row shift register of a first chiplet is connected to the input of the serial row shift register of a second chiplet.

15. The display device of claim 1 further including one or more signal lines wherein one or more of the signal lines is connected to a first chiplet in a first direction, passes through the first chiplet, and is connected to a second chiplet in a second direction different from the first direction.

16. The display device of claim 1 wherein the row electrode and independent column electrode of each pixel is driven by the same chiplet.

* * * * *